United States Patent
Hong (10) Patent No.: US 9,304,169 B2
(45) Date of Patent: Apr. 5, 2016

(54) METHOD FOR PROCESSING POWER SOURCE STATE AND TERMINAL SUPPORTING THE SAME

(71) Applicant: Samsung Electronics Co., Ltd, Gyeonggi-do (KR)

(72) Inventor: Seungsu Hong, Gyeonggi-do (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 214 days.

(21) Appl. No.: 14/078,234

(22) Filed: Nov. 12, 2013

(65) Prior Publication Data

US 2014/0132204 A1 May 15, 2014

(30) Foreign Application Priority Data

Nov. 12, 2012 (KR) .................. 10-2012-0127639

(51) Int. Cl.
*H02J 7/00* (2006.01)
*G01R 31/36* (2006.01)

(52) U.S. Cl.
CPC ............. *G01R 31/3606* (2013.01); *H02J 7/007* (2013.01); *H02J 7/0021* (2013.01)

(58) Field of Classification Search
CPC ..... H02J 7/0021; H02J 7/007; G01R 31/3606
USPC ........................................................ 320/107
See application file for complete search history.

(56) References Cited

U.S. PATENT DOCUMENTS

| | | | |
|---|---|---|---|
| 5,528,148 A * | 6/1996 | Rogers | 320/137 |
| 5,710,501 A * | 1/1998 | van Phuoc et al. | 307/150 |
| 6,940,819 B2 | 9/2005 | Kato | |
| 8,198,863 B1 * | 6/2012 | Wortham | 320/132 |
| 9,121,910 B2 * | 9/2015 | Maluf | G01R 31/3637 |
| 2005/0007068 A1 * | 1/2005 | Johnson et al. | 320/110 |
| 2006/0091858 A1 * | 5/2006 | Johnson et al. | 320/128 |
| 2006/0267548 A1 * | 11/2006 | Uehlein-Proctor et al. | 320/107 |
| 2006/0267556 A1 * | 11/2006 | Uehlein-Proctor et al. | 320/132 |
| 2008/0048621 A1 * | 2/2008 | Yun | 320/136 |
| 2008/0084183 A1 * | 4/2008 | Hoffman et al. | 320/116 |
| 2009/0079263 A1 * | 3/2009 | Crumm et al. | 307/43 |
| 2009/0146826 A1 * | 6/2009 | Gofman et al. | 340/636.2 |
| 2009/0172119 A1 | 7/2009 | Eriksson | |
| 2010/0017155 A1 * | 1/2010 | Nareid | 702/63 |
| 2010/0106353 A1 * | 4/2010 | Watson et al. | 701/22 |
| 2011/0215767 A1 * | 9/2011 | Johnson et al. | 320/136 |
| 2011/0316548 A1 * | 12/2011 | Ghantous et al. | 324/427 |
| 2012/0049802 A1 * | 3/2012 | Barsukov et al. | 320/136 |
| 2012/0200266 A1 * | 8/2012 | Berkowitz et al. | 320/139 |

(Continued)

FOREIGN PATENT DOCUMENTS

| | | |
|---|---|---|
| JP | 2002-281103 | 9/2002 |
| JP | 2003-125020 | 4/2003 |

*Primary Examiner* — Phallaka Kik (57) ABSTRACT

A method for processing a power source state and a terminal supporting the same, wherein the terminal includes a power source configured to supply a specific electric power; a charger IC configured to collect power source information transmitted from a charger to the power source; a gauge IC configured to collect charging information of the power source and to generate gauging information to display a fuel gauge indicating a charging state of the power source based on the power source information transmitted by the charger IC; a control unit configured to display the fuel gauge based on the gauging information transmitted by the gauge IC; and a display unit configured to display the fuel gauge.

20 Claims, 6 Drawing Sheets

(56) References Cited

U.S. PATENT DOCUMENTS

2013/0066573 A1* 3/2013 Bond et al. ................ 702/63
2013/0082662 A1* 4/2013 Carre et al. ................ 320/134
2013/0169038 A1* 7/2013 King ............................ 307/10.1
2015/0219722 A1* 8/2015 Maluf et al. ................ 324/426
2015/0247902 A1* 9/2015 Wortham ............. G01R 31/362
324/427

* cited by examiner

| FINAL CHARGING CURRENT DETECTOR | ~191 |
| SYSTEM POWER DISTRIBUTER | ~193 |
| PRE-CHARGING SUPPORTER | ~195 |
| SUPPLEMENTAL CHARGING SUPPORTER | ~197 |

FIG. 5

METHOD FOR PROCESSING POWER SOURCE STATE AND TERMINAL SUPPORTING THE SAME

CROSS-REFERENCE TO RELATED APPLICATION(S) AND CLAIM OF PRIORITY

The present application is related to and claims the benefit under 35 U.S.C. §119(a) of a Korean patent application filed on Nov. 12, 2012 in the Korean Intellectual Property Office and assigned Serial No. 10-2012-0127639, the entire disclosure of which is hereby incorporated by reference.

TECHNICAL FIELD

The present disclosure relates to a power source for a terminal and, more particularly, to a method for processing a power source state and a terminal supporting the same, which support identifying a power source state of the terminal and correctly displaying the power source state.

BACKGROUND

Recently, electronic terminals have become widely used due to their mobility. In particular, mobile communication terminals enable voice communication while moving, and thereby are very popularly with most people.

A portable terminal uses a specifically movable and portable electric power source for an electric drive. Currently, a portable battery manufactured in a specific size is used as an electric power source for the drive of the portable terminal, and a charger is used for operating the portable terminal as well as charging the battery by connecting to the terminal. The portable terminal checks a residual amount of the battery and displays the checked result through a display unit of the portable terminal. Therefore, a user can know how much battery power is remaining and how much the battery is charged in a charging state, by identifying the residual amount of the battery displayed through the display unit.

However, a function of checking a battery state applied to a related portable terminal has a problem in that the checked results are not consistent according to a subject detecting and identifying a battery state in charging or discharging due to electric deviations in various properties or internal components. Such a problem results in generating an error between a battery charging state and display information of the corresponding state. As a result, users cannot be convinced of the battery state due to wrong display information, and frequently request solutions to these problems.

SUMMARY

To address the above-discussed deficiencies of the prior art, it is a primary object to provide a method for processing a power source state and a terminal supporting the same, enabling a correct display of power source state and charging state, and a proper control of the charging state.

In order to achieve the above object, the present application discloses a method for processing a power source state, including: supplying electric power for charging a power source, transmitting power source information collected by a charger IC charging the power source to a gauge IC displaying a charging state of the power source as a fuel gauge, generating gauging information for displaying the fuel gauge based on the power source information provided by the gauge IC for the charger IC, and displaying the fuel gauge based on the gauging information.

In order to achieve the above object, the present application discloses a terminal supporting the method for processing a power source state, including: a power source configured to supply a specific electric power, a charger IC configured to collect power source information provided by a charger for the power source, a gauge IC configured to collect charging information of the power source and to generate gauging information to display a fuel gauge indicating a charging state of the power source based on the power source information provided by the charger IC, a control unit configured to display the fuel gauge based on the gauging information provided by the gauge IC, and a display unit configured to display the fuel gauge.

As described above, according to the method for processing a power source state and the terminal supporting the same, a battery state can be more practically and correctly displayed regardless of differences between physical properties of terminal components and correct user's identification of the battery state can be supported through a more precise control of charging state, and thereby the operation of the terminal can be performed easily.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 6, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless communication device. Hereinafter, certain embodiments of the present disclosure are described in detail with reference to the accompanying drawings. The same reference symbols are used throughout the drawings to refer to the same or like parts. Detailed descriptions of well-known functions and structures incorporated herein can be omitted to avoid obscuring the subject matter of the present disclosure.

For the same reasons, some components in the accompanying drawings are emphasized, omitted, or schematically illustrated, and the size of each component does not fully reflect the actual size. Therefore, the present disclosure is not limited to the relative sizes and distances illustrated in the accompanying drawings.

Figure 1:
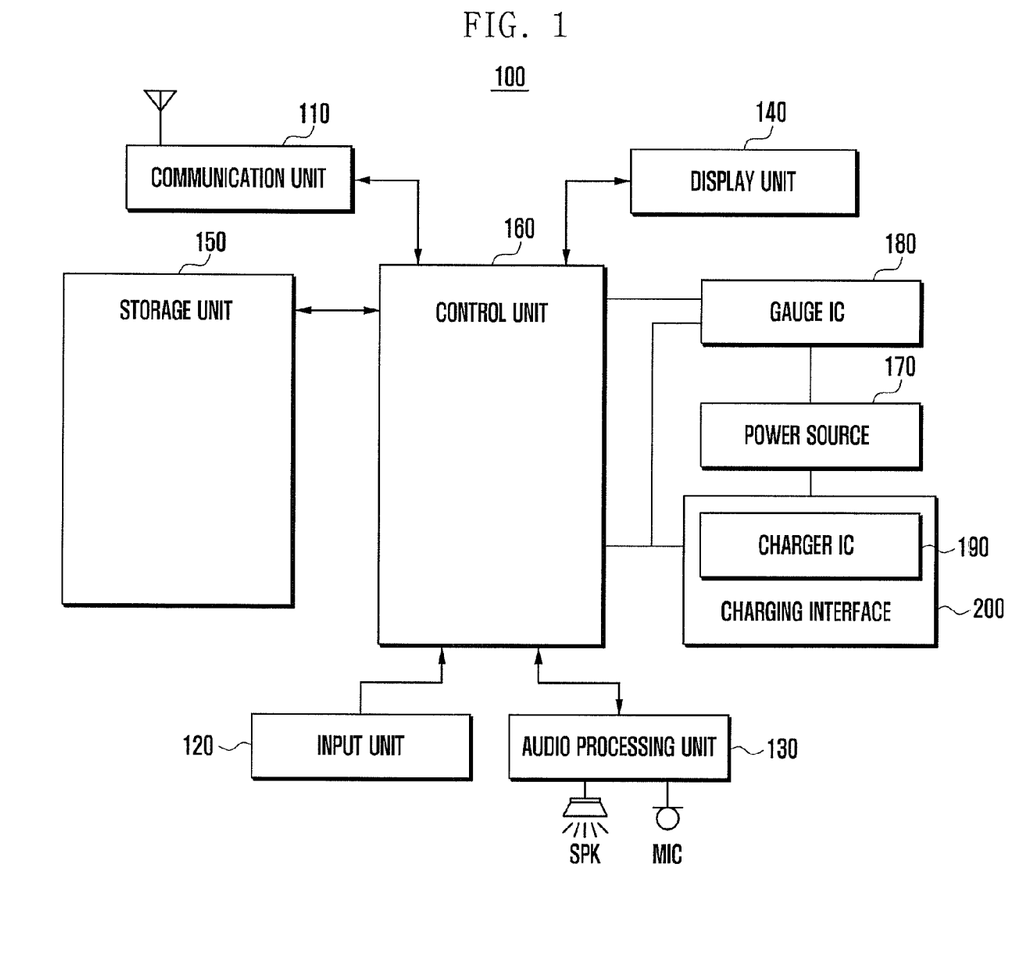
FIG. 1 is a block diagram showing a configuration of terminal processing a power source state according to certain embodiments of the present disclosure.

FIG. 1 is a block diagram showing a configuration of terminal processing a power source state according to certain embodiments of the present disclosure.

Referring to FIG. 1, the terminal 100 according to the present disclosure includes a communication unit 110, input unit 120, audio processing unit 130, display unit 140, storage unit 150, power source 170, gauge IC 180, charging interface 200 having a charger IC 190, and control unit 160.

In the terminal 100 having the above configuration according to the present disclosure, if a charger (not shown) is connected through the charging interface 200 to charge the electric power of the power source 170, the charger IC 190 detects the connection of the charger and provides information related to charging the power source 170 for the gauge IC 180. The gauge IC 180 provides gauging information for the control unit 160 based on the electric power stored or charged in the power source 170. In particular, the gauge IC 180 updates the gauging information based on the charging information provided by the charger IC 190, and provides the gauging information for the control unit 160. In this process, the gauge IC 180 can reflect and process a more correct state of the power source 170 through the information of the charger IC 190 and the power source 170.

For example, as the charger IC 190 directly provides charging information for the gauge IC 180, the terminal 100 reflects a charging state change of the power source 170 to a fuel gauge according to physical properties of the charger IC 190. Therefore, the terminal 100 according to the present disclosure can properly display state information of the power source 170 so that the state information corresponds to an actual charging state.

The communication unit 110 is a component supporting a communication function of the terminal 100, which can be omitted if the terminal 100 does not support the communication function. The communication unit 110 supports the communication function by being activated according to a user's request for communication function, predetermined schedule information, or external request. The communication unit 110 can include a broadcast receiving module and a local area network module as well as chips for a telecommunication function and a data communication function of the terminal 100. According to the setting of the terminal 100, the communication unit 110 can form a communication channel for providing state information of the power source 170, for example, a specific charging amount or a fully charged state, for an external device or specific equipment. The state information of the power source 170 provided by the communication unit 110 for another terminal or specific equipment is information collected by the gauge IC 180 and transmitted to the control unit 160, and information collected by the charger IC 190 and transmitted to the control unit 160. Hereinafter, examples of charging states of the power source 170 are described based on a specific charging ratio. Here, the charging ratio of the power source 170 can be defined by a voltage value actually formed in the power source 170, final charging current value in charging of the power source 170, or current value change.

The input unit 120 is a component generating an input signal of the terminal 100. For this, the input unit 120 can be configured in various forms such as a key button, keypad, home key, and side key. In generating an input signal for the terminal 100, a touch panel or a touch screen included in the display unit 140 can operate as an input unit 120. The input unit 120 can include a button generating a request signal for supplying an electric power. If the terminal 100 is installed with an application providing state information of the power source 170, an input signal for selecting and activating the corresponding application can be generated according to user's request.

The audio processing unit 130 outputs and collects an audio signal of the terminal 100. For this, the audio processing unit 130 can include a speaker SPK outputting an audio signal and a microphone MIC collecting an audio signal. The audio processing unit 130 can output various audio signals related to the state of the power source 170 of the terminal 100. For example, the audio processing unit 130 can output a guide sound or an effect sound indicating completion of charging when charging of the terminal 100 is completed. Further, the audio processing unit 130 according to the present disclosure can output the guide sound or effect sound when the terminal 100 is charged with more than a predetermined amount or discharged with more than another predetermined amount. A function of outputting the guide sound or effect sound of charging by the audio processing unit 130 can be omitted according to a design of terminal or a user's setting.

The display unit 140 is a component outputting various screens according to the operation of the terminal 100. The display unit 140 can provide screens such as a waiting screen and a menu screen according to the operation of the terminal 100, and output specific user function screens such as a file play screen, file search screen, broadcast reception screen, and web connection screen, according to a user's selection or predetermined schedule information. The display unit 140 can be configured with a touch screen having a touch panel and a display panel, and thereby can operate as an input means.

In particular, the display unit 140 according to the present disclosure can output a fuel gauge related to a power state of the power source 170. The fuel gauge is displayed at least one side of the display unit 140, for example, displayed in an indicator area disposed at the upper side of the display unit 140. The fuel gauge can be provided in a specific application form according to the functions supported by the terminal 100. The fuel gauge can be output through the display unit 140 as an icon, specific image, or specific page, and in different shapes, colors, and arrangements according to the power state of the power source 170. The fuel gauge can be displayed through the display unit 140 under the control of the control unit 160 which collects and outputs gauging information provided by the gauge IC 180. Accordingly, the shape, color, and arrangement of the fuel gauge can change according to the gauging information provided by the gauge IC 180.

The storage unit 150 is a component storing various programs and data related to the operation of the terminal 100. For example, the storage unit 150 can store an operating system of the terminal 100, applications supporting various user functions such as a file play function, file edit function, file transmission function, web connection function, and broadcast reception function, and temporarily or permanently store data generated, received, or collected according to execution of corresponding functions. In particular, the storage unit 150 according to the present disclosure can store a specific application for displaying a fuel gauge and more detailed information related to the power source 170 according to a support form of the corresponding application. For example, the storage unit 150 can store fuel gauge history information according to the specific application.

The storage unit 150 can store diversified information for the operation of the gauge IC 180 related to the display of fuel gauge according to the present disclosure. For example, the storage unit 150 can store the present charging state information of the power source 170 collected by the gauge IC 180. Further, the storage unit 150 can store a final charging current which the charger IC 190 supplies to the gauge IC 180. The final charging current can be divided into a plurality of kinds according to the charging state of the power source 170 or the design of charger or terminal 100, and the storage unit 150 can store such information corresponding to a change of final charging current. Additionally, the storage unit 150 can temporarily store a voltage value or a current value of the power source 170 detected by the gauge IC 180. Namely, the storage unit 150 supports a function of storing information collected by the gauge IC 180 and information collected by the charger IC 190. At least one of the voltage value and the current value detected by the gauge IC 180 is transmitted to the control unit 160 for displaying a fuel gauge.

The power source 170 is a component supplying an electric power to the terminal 100. The power source 170 can be provided in a battery form, and can be installed in the terminal 100 in a sealed form or a replaceable form. The power source 170 can be formed with a secondary battery enabling charging and discharging. The power source 170 can be disposed in an installation space separately prepared in the terminal 100. The power source 170 disposed in the installation space is electrically connected to the gauge IC 180 and charger IC 190 of the terminal 100. The power source 170 can have specific amounts of voltage and current according to a charging state.

If the power source 170 is installed in the installation space of the terminal 100, the gauge IC 180 is electrically connected to the power source 170 and detects state information of the power source 170. The gauge IC 180 then transmits the detected state information of the power source 170 to the control unit 160. The gauge IC 180 can selectively perform detection of the power source 170 according to the charging state of the power source 170. For example, if a charging ratio of the power source 170 is higher than a predefined value in full charging, the gauge IC 180 does not detect the voltage and current of the power source 170 but transmits gauging information to the control unit 160 according to information provided by the charger IC 190. If the power source 170 is out of the full charging section, the gauge IC 180 detects the voltage and current of the power source 170 and transmits the gauging information to the control unit 160. If the power source 170 is almost discharged, the gauge IC 180 holds the detection of voltage and current until information of pre-charging completion is received from the charger IC 190, and starts the detection of voltage and current of the power source 170 after the completion of the pre-charging. In order to support the above function, the gauge IC 180 can share state information of the power source 170 with the charger IC 190. Hereafter, the gauge IC 180 is described in more detail referring to the accompanying drawings.

The charging interface 200 is a physical interface disposed at a side of the terminal 100 to which a charger is connected. For example, the charging interface 200 can be provided in a connector form so that a plug of the charger can be inserted. The charging interface 200 can include an electrical path between the charger and the power source 170 to supply an electric power to the power source 170. The charger IC 190 is disposed in the electric path, and thereby a state of charging power supplied from the charger to the power source 170 and a state of power charging the power source 170 can be identified.

As described above, the charger IC 190 is disposed at a side of the charging interface 200, which is a component checking the charging power of the power source 170. In particular, while the charger charges the power source 170, the charger IC 190 detects a final charging current supplied from the charger to the power source 170, and transmits the detected information to the gauge IC 180. The final charging current of the power source 170 can change according to the charging state. For example, if the power source 170 is discharged to more than a predetermined ratio, the charger supplies a first charging current to the power source 170. If the power source 170 is charged more than another predetermined ratio, the power source 170 is charged with a second or third charging current according to the charging amount. The charger IC 190 detects and identifies such a charging current change of the power source 170, and transmits the detected information to the gauge IC 180.

If a predefined value of final charging current is maintained for a predetermined time, the charger IC 190 identifies the state of the power source 170 as a fully charged state, and controls to stop charging of the power source 170. For this, the charger IC 190 can include a switch temporarily cutting off the electric path between the charger and the power source 170, or can be designed to control a corresponding switch. Additionally, the charger IC 190 can identify the current amount distributed to the control unit 160 in the process of detecting the change of final charging current supplied from the charger, and control the termination of charging the power source 170 by identifying the current amount distributed to the control unit 160. For example, if the final charging current decreases to a predetermined value due to the distribution of current to the control unit 160, the charger IC 190 identifies that the corresponding state is not due to full charging but due to the distribution of current to the control unit 160, and maintains the charging without stopping the charging. Here, the charger IC 190 can transmit the information of current amount distributed to the control unit 160 to the gauge IC 180.

The control unit 160 is a component supporting controls of various signal flows, data transmission, display of fuel gauge, and updating the display of fuel gauge related to the terminal 100 for processing the power source state according to certain embodiments of the present disclosure. In particular, the control unit 160 receives information related to the power source 170, which is provided by the gauge IC 180, and controls display of the fuel gauge according to the received information of the power source 170. Here, the gauge IC 180 can provide information of the power source by including gauging information, and thereby the control unit 160 can control to display and update the fuel gauge by using the gauging information provided by the gauge IC 180. If an input signal of selecting an application for displaying the fuel gauge is received according to a user's request, the control unit 160 activates the corresponding application according to the input signal for selecting an application. The control unit 160 then controls the display unit 140 to display a fuel gauge display screen according to the activated application. In this process, the control unit 160 can control to display the fuel gauge also in an indicator area.

The control unit 160 can control outputs of various audio signals related to the charging of the power source 170. Namely, the control unit 160 can control outputs of the guide sound and effect sound related to the charging mentioned in the description of the audio processing unit 130.

Figure 2:
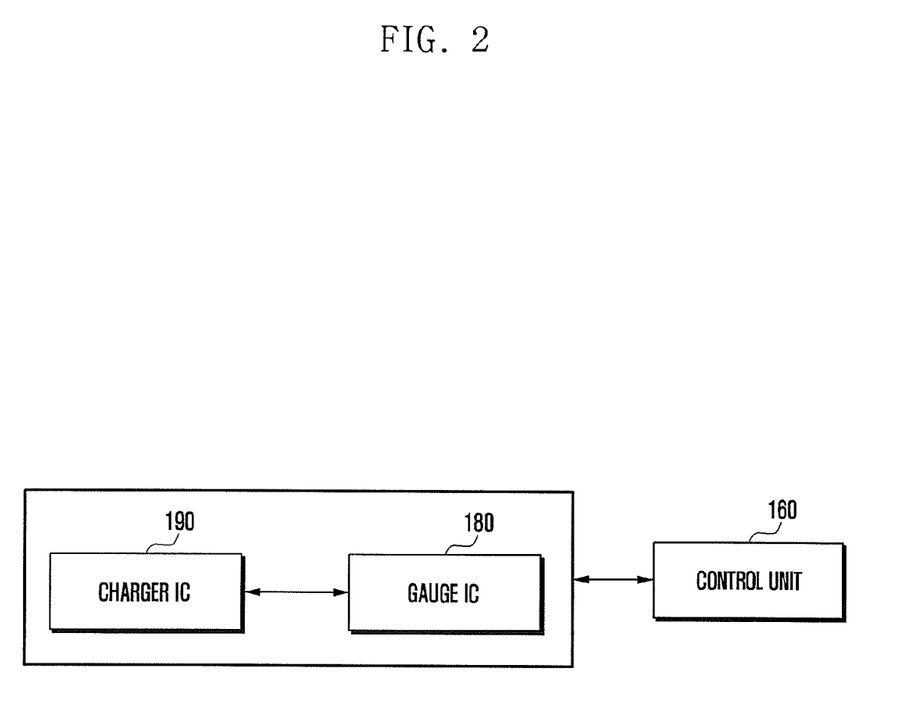
FIG. 2 is a block diagram showing a partial configuration of the components of FIG. 1 for processing a power source state according the present disclosure.
Figure 3:
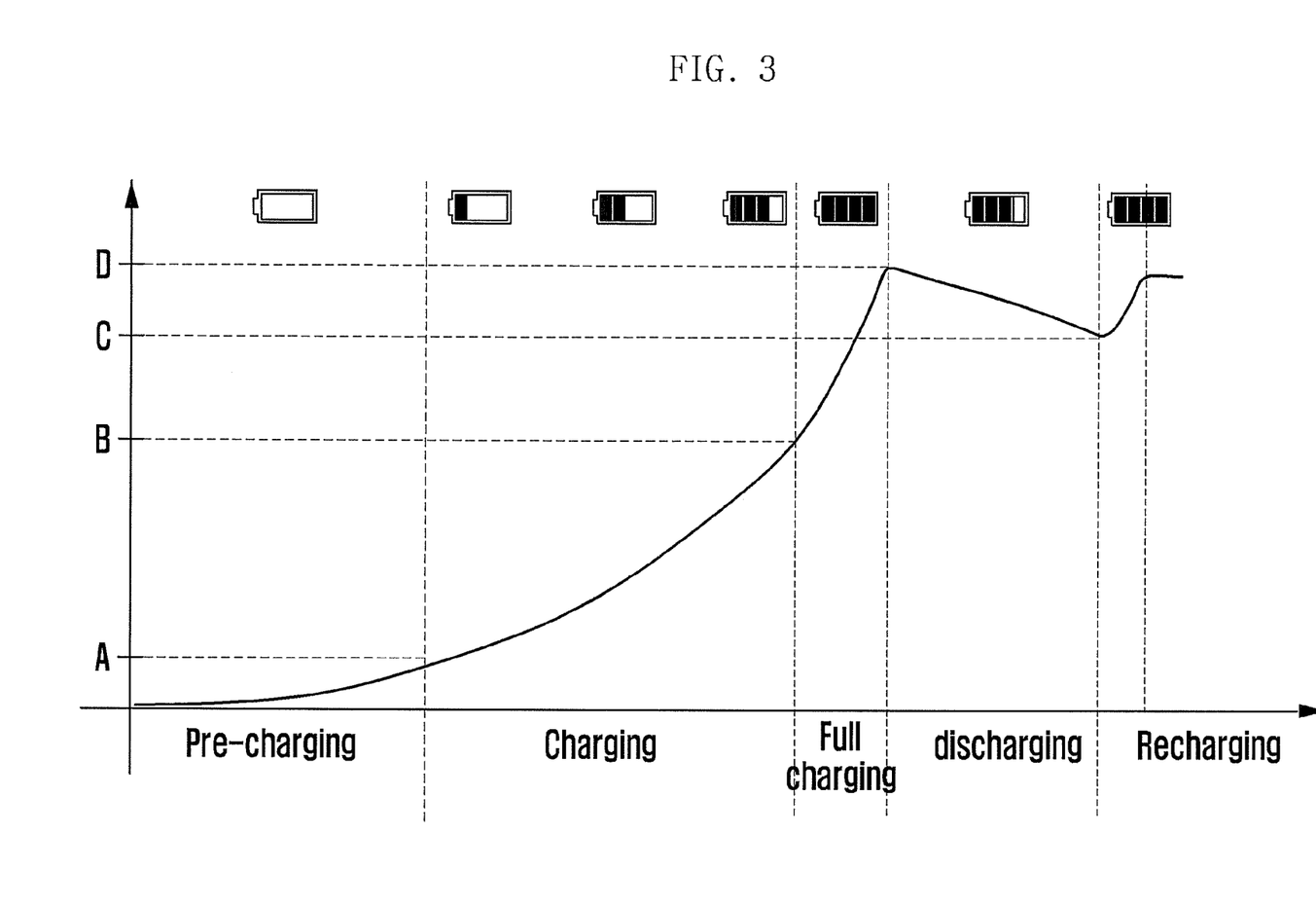
FIG. 3 is a graph showing a power source state change in charging.

FIG. 2 is a drawing illustrating only the components required for processing the state of the power source 170 according to the certain embodiments of the present disclosure, and FIG. 3 is a drawing to explain charging of the power source 170 when a charger is connected to the terminal 100.

Referring to FIGS. 2 and 3, the power source 170 installed in the terminal 100 according to the present disclosure can have a pre-charging section, charging section, full charging section, discharging section, and recharging section according to the state of charging. The charging state of the power source 170 shown in FIG. 3 starts from a fully discharged state.

Firstly, the pre-charging section is a section between a state that the power source 170 is fully discharged and a state that the power source 170 is charged with a predetermined amount of electric power supplied by the charger. The size of the pre-charging section can differ according to characteristics of the power source 170. While the power source 170 supplies an electric power to the terminal 100, the terminal 100 maintains the minimum amount of electric power in the power source 170 for the purpose of protecting the power source 170. Accordingly, the amount of electric power charged in the pre-charging section cannot actually be used for the operation of the terminal 100 even though the amount of electric power is stored in the power source 170. For example, if the total amount of electric power charged in the power source 170 is assumed to be 100%, the terminal 100 can be designed to stop the operation and maintain a turn-off state when a shortage of the electric power is generated, for example, when a residual amount of electric power in the power source 170 becomes 3%. The residual amount of electric power in the power source 170 gradually decreases due to natural discharge, and can become "0" after a specific time is elapsed. As a result, even though the power source 170 is charged in the pre-charging section, the gauge IC 180 processes the gauging information as "0".

If the power source 170 is initially installed in the terminal 100 and a charger is connected, the gauge IC 180 operates by using an electric power supplied by the charger, and detects the voltage and current of the power source 170. If the residual amount of electric power in the power source 170 is less than a predetermined value, for example, 3%, the gauge IC 180 can transmit gauging information "0" to the control unit 160. This gauging information "0" can be continued until the pre-charging is completed. The terminal 100 according to the present disclosure performs displaying a fuel gauge based on gauging information of effective charging amount in the power source 170 by disregarding the electric power charged in the pre-charging section as described above. The charger IC 190 supplies the electric power provided by the charger to the power source 170. Here, the charger IC 190 can supply the electric power with a predefined final charging current for the purpose of protecting the power source 170. Alternatively, the charger IC 190 can charge the power source 170 with a predefined constant current. In the above description, the gauge IC 180 identifies the pre-charging section of the power source 170 corresponding to the connection of the charger, however such a function can be performed by the charger IC 190 and information collected by the charger IC 190 can be provided to the gauge IC 180. If a charger is connected to charge the power source 170, the charger IC 190 checks a charging state of the power source 170, and if the charging state is in the pre-charging section, the charger IC 190 transmits the corresponding information to the gauge IC 180. When detecting a voltage and a current of almost discharged power source 170, the charger IC 190 can more correctly check the current amount of the charger for charging the power source 170, and thereby the terminal can be designed so that the charger IC 190 collects information of the pre-charging section. In this case, the gauge IC 180 can wait without detecting the voltage and current in the pre-charging section, and can generate gauging information based on the information provided by the charger IC 190 and transmit the gauging formation to the control unit 160.

The charging section is a section in which the electric power of the charger charges the power source 170, and can have a predetermined ratio range, for example, a range of 3%~90%. Here, the predetermined ratio range can be a range starting from the pre-charging section until a predetermined charging amount is reached before the full charging section. In the charging section, the charger IC 190 performs charging by supplying the electric power provided by the charger to the power source 170. Here, the charger IC 190 detects a change of final charging current and transmits it to the gauge IC 180. Alternatively, the charger IC 190 can perform the charging by supplying a constant current to the power source 170 in the charging section.

In the charging section, the gauge IC 180 can directly detect the voltage and current of the power source 170 regardless of final charging current value provided by the charger IC 190. The gauge IC 180 identifies a charging state change of the power source 170 based on the detected voltage and current values, and accordingly generates gauging information and transmits it to the control unit 160. For example, the gauge IC 180 detects a voltage value of the power source 170. If the detected voltage value is greater than a predefined value and maintained for a predetermined time, the gauge IC 180 identifies that the charging state of the power source 170 corresponds to the predefined ratio, and transmits the corresponding gauging information to the control unit 160.

The full charging section corresponds to a state that the power source 170 is charged more than a predefined amount of electric power, a state that the power source 170 has a predefined voltage value, or a state that the final charging current of the power source 170 is equal to a predefined current value. For example, the full charging section corresponds to a state that the charged voltage value of the power source 170 is greater than 4.1V or a state that the final charging current of the power source 170 changes from a specific current value to another current value. Here, the full charging section is explained as a charging state having a specific charging ratio, for example, 90%, however practically can be a charging section before the detected voltage of the power source 170 becomes a specific voltage value, for example, 4.0V~4.2V. Here, as the range of the full charging section, the values such as 90%, 4.0V, and 4.2V can be changed according to a designer's intention of the power source 170.

The full charging section can be a section in which the final charging current changes in a predefined form. In more detail, the charger IC 190 according to the present disclosure can detect the final charging current and transmits it to the gauge IC 180 while the charger charges the power source 170 as described above. The supply of final charging current is performed in the full charging section. For example, the charger IC 190 can transmit information of final charging current value 400 mA to the gauge IC 180 for a predetermined time, and transmit information of final charging current value 300 mA to the gauge IC 180 after elapsing a predetermined time. Further, the charger IC 190 can transmit information of final charging current 200 mA to the gauge IC 180 for a specific time. Here, if a fully charged state is designed to have a final charging current 200 mA for a predetermined time, the charger IC 190 decides that the power source 170 reached the fully charged state when the final charging current becomes 200 mA. The charger IC 190 then cuts off a power supply path to stop the power supply of the charger and transmits full charging information to the gauge IC 180.

By receiving sequentially the final charging current from the charger IC 190 in the full charging section, the gauge IC 180 can predict a charging state change of the power source 170. Accordingly, the gauge IC 180 can generate gauging information by directly detecting the voltage and current in the charging section, and generate gauging information based on the information provided by the charger IC 190 in the full charging section. Namely, the gauge IC 180 generates gauging information based on the change of final charging current value and a state of maintaining a power supply with the changed current value, and transmits it to the control unit 160. Accordingly, even though the gauge IC 180 detects different voltage and current from those of the charger IC 190 due to mechanical deviation or physical characteristics, the gauge IC 180 generates gauging information based on the information transmitted by the charger IC 190, and thereby can correctly reflect the charging state of the power source 170 provided by the charger IC 190 regardless of the deviation. In particular, the gauge IC 180 sequentially reflects the charging state change of the power source 170, and properly reflects identification of fully charged state by the charger IC 190 and display of fuel gauge at the time of cutting off the power supply of the charger correspondingly. In this process, even though the detected current value has a deviation with that of the charger IC 190 due to mechanical differences, the gauge IC 180 provides a change of fuel gauge based on the information provided by the charger IC 190, and thereby can control to properly display the charging state change by eliminating a rapid charging state change due to deviations in detected values. For example, in a state that the gauge IC 180 identifies the charging state of the power source 170 is still before the fully charged state, the charger IC 190 can identify the charging state of the as a fully charged state and terminate the charging. In this situation, the gauge IC 180 can calculate a completion time of the full charging by identifying in real time or periodically the change of final charging current provided by the charger IC 190, and can control to display a fuel gauge applied by the corresponding gauging information. In the structure of the terminal 100 according to the present disclosure, if the gauge IC 180 identifies a fully charged state of the power source 170 prior to the charger IC 190, the gauge IC 180 can display a fuel gauge accordingly and request the charger IC 190 to terminate the charging. Namely, even though the gauge IC 180 identifies a fully charged state, if the charger IC 190 identifies that the power source 170 is still in a state before the fully charged state, the gauge IC 180 can display an fuel gauge based on the power source related information received from the charger IC 190. Alternatively, the gauge IC 180 can request the charger IC 190 to terminate the charging according to its own decision on the fully charged state.

If the output of the charger is divided into the operation of the control unit 160 and charging the power source 170, and if the charging current for the power source 170 decreases to lower than the final charging current due to the increase of current consumption for the operation of the control unit 160, a function protecting misjudgment of full charging provided by the charger IC 190 can be applied to the gauge IC 180. Namely, the charger IC 190 can transmit current distribution information to the gauge IC 180 if a specific amount of current is supplied to the control unit 160 for the operation of the control unit 160 in the process of supplying a current from the charger to the power source 170 for charging. Therefore, the gauge IC 180 does not misunderstand that the power source 170 reached a fully charged state even though the power source 170 is charged with the final charging current, for example, 200 mA for a predetermined time. Resultantly, more correct display of fuel gauge can be achieved corresponding to the actual charging state of the power source 170.

The discharging section is a section in which natural discharging starts after disconnecting the charger from the fully charged power source 170. In this section, the gauge IC 180 or the charger IC 190 detects the voltage and current of the power source 170, and identifies whether the charged amount of the power source 170 decreases to a predefined amount, for example, from 100% to 97%. Actually, the gauge IC 180 or the charger IC 190 checks whether the voltage of the power source 170 decreases from a fully charged state to a predefined voltage, for example, from 4.2V to 4.13V, and thereby it can be identified whether the power source 170 is in a discharging section. In the discharging section, the gauge IC 180 cannot provide the gauging information or can provide gauging information of discharging state to the control unit 160 according to the design of the terminal 100. Accordingly, a fuel gauge indicating a state that a specific amount of electric power is discharged can be displayed in the display unit 140.

A micro current can flow in the power source 170 in a state that power source 170 is fully charged, or charging or discharging is not performed. If the micro current is detected, the gauge IC 180 identifies it as a charging state and updates the fuel gauge, and thereby a deviation can be generated between an actual state of the power source 170 and the display of fuel gauge. The charger IC 190 can display a normal value of fuel gauge by transmitting information of fully charged state or state not performing charging or discharging of the power source 170 to the gauge IC 180, so that a detecting error of 0 A (zero ampere) in the power source 170, namely, misrecognition of non-charging state can be disregarded.

If the power source 170 is checked to have a voltage lower than a predetermined value or an electric power amount of the power source 170 is decreased due to prolonged discharging, the gauge IC 180 or the charger IC 190 can engage and control a recharging section in which the electric power amount due to the natural discharging is supplemented by the recharging. In a supplemental charging section and a recharging section, the terminal 100 according to the present disclosure does not identify a voltage decrease but controls to perform supplemental charging or recharging when the electric power amount detected by the gauge IC 180 decreases to a predetermined value. This function can solve a problem in recharging a power source 170 having a poor impedance or having poor electrical characteristics due to deterioration of the power source 170. If a power source 170 in a poor state is connected to a charger in the supplemental charging section or recharging section and disconnected from the charger after full charging, an excessive voltage drop is generated. The charger IC 190 then misrecognizes that the power source 170 is discharged with a predetermined amount of electric power corresponding to the voltage drop and performs the supplemental charging or recharging by reconnecting the charger to the power source 170. However, the terminal 100 according to the present disclosure avoids an error of repeating the supplemental charging by performing the supplemental charging based on the electric power amount of the power source 170 detected by the gauge IC 180 instead of the electric power amount detected by the charger IC 190.

In the above description, examples have been explained for charging states which the power source 170 can have after almost discharged. The charging can start from s specific section according to a residual electric power amount of the power source 170. For example, a specific power source 170 can be charged from the charging section without engaging and controlling the pre-charging section, or from the full charging section. In these cases, the terminal 100 according to the present disclosure can perform charging and display of fuel gauge according to an actual state of the power source 170, such as a charging state of the power source 170 detected by the charger IC 190 and the gauge IC 180, and a state of electric power distribution for charging the power source 170.

Figure 4:
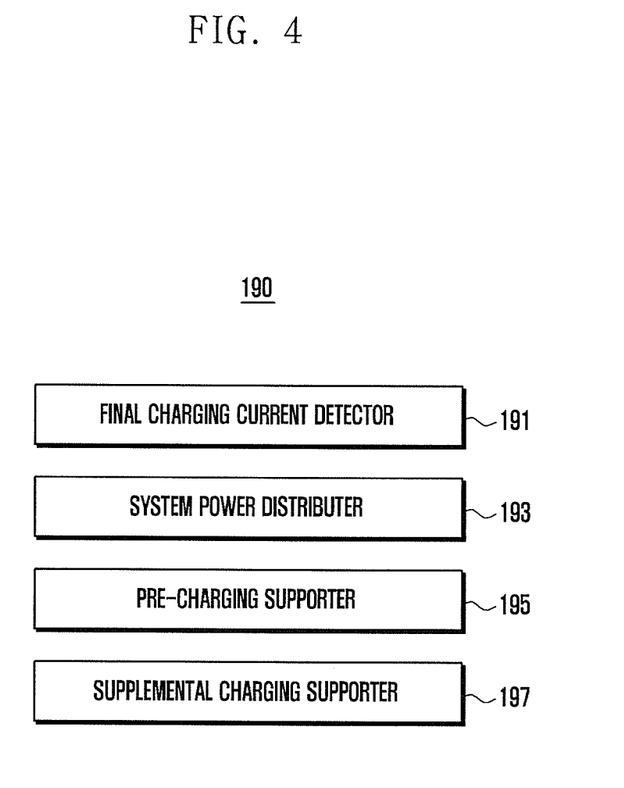
FIG. 4 is a block diagram showing a detailed configuration of a charger IC according to the present disclosure.

FIG. 4 is a drawing showing a detailed configuration of charger IC 190 according to certain embodiments of the present disclosure.

Referring to FIG. 4, the charger IC 190 according to the present disclosure includes a final charging current detector 191, system power distributor 193, pre-charging supporter 195, and supplemental charging supporter 197. In this configuration, the charger IC 190 detects a charging state of the power source 170, and transmits corresponding feedback information to the gauge IC 180 if a charger is inserted into a charging interface 200. In this process, the charger IC 190 can receive the feedback information of the power source 170 collected by the gauge IC 180. Further, the charger IC 190 can transmit to the gauge IC 180 feedback information "Low battery state" of which the charging amount of the power source 170 is less than a predetermined value, and performs supplemental charging according to the discharging amount of the power source 170.

For this, the final charging current detector 191 is a component detecting a final charging current supplied to the power source 170. The final charging current detector 191 transmits the detected final charging current to the gauge IC 180. In particular, the final charging current detector 191 can transmit a changed value of the final charging current to the gauge IC 180 at the time of final charging current changed.

The system power distributor 193 collects information of a current amount supplied to the power source 170 and a current amount supplied to the control unit 160. The system power distributor 193 can provide the current amount supplied to the power source 170 and the current amount supplied to the control unit 160 for the gauge IC 180. In particular, if the current amount supplied to the power source 170 decreases to less than a predetermined value, the system power distributor 193 can provide the gauge IC 180 with information of the current amount supplied to the control unit 160.

The pre-charging supporter 195 is a component engaging a pre-charging section of the power source 170. The pre-charging supporter 195 identifies a charging state of the power source 170, and performs pre-charging of the power source 170 if the power source is fully discharged. Further, the pre-charging supporter 195 can provide the gauge IC 180 with information of ongoing pre-charging from the fully discharged state of the power source 170.

The supplemental charging supporter 197 is a component re-charging the power source 170 if the electric power amount of the power source 170 is less than a predetermined value. In this process, the supplemental charging supporter 197 can provide the gauge IC 180 with information of discharging state of the power source 170. The supplemental charging supporter 197 receives the information of discharging state of the power source 170 from the gauge IC 180, and performs re-charging if the electric power amount of the power source 170 is less than a predetermined value.

The charger IC 190 performs charging of the power source 170 with a constant current and constant voltage for a predetermined time according to a predesigned method. In particular, the charger IC 190 controls a charging time of the power source 170 with a constant current or voltage by sharing charging state feedback information of the power source 170 with the gauge IC 180, and thereby speedier and safer charging of the power source 170 can be achieved. For example, even if differences between detected values generate due to physical differences between the charger IC 190 and the gauge IC 180, the power source 170 can be charged by using a changed charging current value or charging voltage value when the power source 170 should be charged with the constant current or constant voltage. Adversely, the power source 170 can be charged by using a corresponding value when the power source 170 should not be charged with the constant current or voltage. In these cases, the power source 170 can be physically damaged. However, the present disclosure provides more correct identification of charging state by sharing the detected values of the power source 170 between the charger IC 190 and the gauge IC 180 and controls the charging accordingly, and thereby relatively speedy and safe charging can be achieved.

Figure 5:
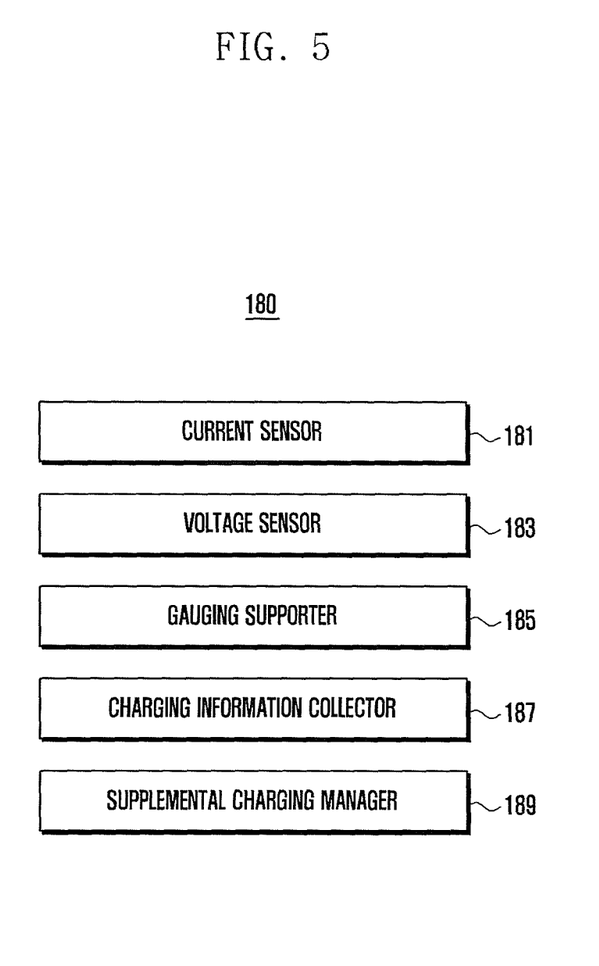
FIG. 5 is a block diagram showing a detailed configuration of a gauge IC according to the present disclosure.

FIG. 5 is a drawing showing a detailed configuration of gauge IC 190 according to certain embodiments of the present disclosure.

Referring to FIG. 5, the gauge IC 180 according to the present disclosure includes a current sensor 181, voltage sensor 183, gauging supporter 185, charging information collector 187, and supplemental charging manager 189. The gauge IC 180 having such a configuration can provide charging state feedback information of the power source 170 for the charger IC 190, and receive charging state feedback information of the power source 170 from the charger IC 190. The gauge IC 180 can avoid a faulty operation due to a poor impedance of the power source 170 in a charging control process of the charger IC 190, and can perform termination of charging not based on the charger IC 190 but based on the gauge IC 180 according to the design of the terminal 100. Such a function enables normal charging of the power source 170 of the terminal 100 without replacing a hardware by performing the charging control based on the gauge IC 180 if the charger IC 190 is in a poor state.

The current sensor 181 included in the gauge IC 180 according to the present disclosure is a component detecting a current value of the power source 170. The current value detected by the current sensor 181 can be converted to gauging information, and the converted gauging information can be provided for the control unit 160. In order to provide gauging information from the current value detected by the current sensor 181, a predefined table matching a specific current value to gauging information is provided for the gauge IC 180. This table can be stored in the storage unit 150 or in a separate memory provided for the gauge IC 180.

The voltage sensor 183 is a component detecting a voltage state of the power source 170. The voltage value detected by the voltage sensor 183 cancan be provided for the control unit 160 by converting to gauging information by matching. For this, the terminal 100 can provide a table matching the voltage value detected by the voltage sensor 183 to gauging information. The terminal 100 can provide a gauging information matching table according to the current value and voltage value.

The gauging supporter 185 is a component converting a current value and a voltage value provided by at least one of the current sensor 181 and the voltage sensor 183 to gauging information referring to the matching table, and transmitting the converted gauging information to the control unit 160. Accordingly, the gauging supporter 185 can identify a current charging state of the power source 170 based on at least one of the detected current value and voltage value. Namely, the gauging supporter 185 provides information for displaying a fuel gauge, for example, whether the current charging state of the power source 170 is 90% or 100%, or whether the power source is in a low voltage state.

The charging information collector 187 is a component collecting information of the power source 170 in various charging state. Namely, the charging information collector 187 collects information, whether the power source 170 is in a fully discharged state or fully charged state. This information can be received from the charger IC 190, or can be collected from a current value or a voltage value detected by the current sensor 181 or the voltage sensor 183. The information collected by the charging information collector 187 can be shared with the charger IC 190, and if the power source 170 is in a fully charged state, the charging information collector 187 can terminate the charging by transmitting the corresponding feedback information to the charger IC 190.

The supplemental charging manager 189 is a component managing re-charging of the power source 170 after a natural discharge. If the power source 170 is discharged more than a predetermined amount by the natural discharge after full charging, the supplemental charging manager 189 can request the charger IC 190 for recharging of the power source 170. Here, the supplemental charging manager 189 can control the charger IC to stop the recharging if the charger IC 190 attempts to recharge the power source 170 in a predetermined time after the recharging due to a voltage drop. The supplemental charging manager 189 identifies whether the residual power amount of the power source 170 is less than a predefined value, and controls the charger IC 190 to perform the recharging of the power source 170 by alarming the charger IC 190 if the residual power amount of the power source 170 is less than a predefined value.

Figure 6:
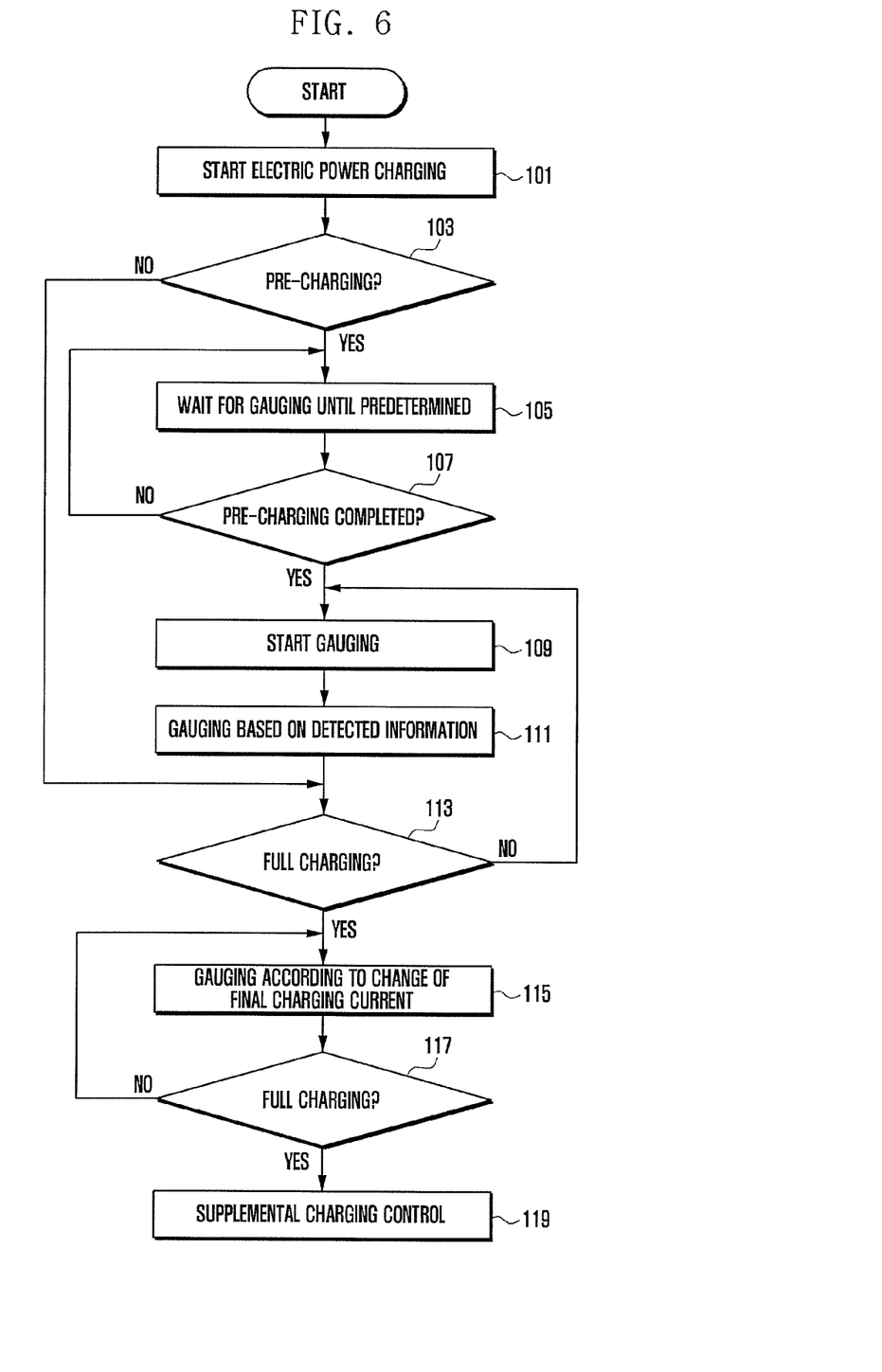
FIG. 6 is a flow chart showing a method for processing a power source state according to the present disclosure.

FIG. 6 is a flow chart showing a method for processing a power source state according to certain embodiments of the present disclosure.

Referring to FIG. 6, the method for processing a power source state according to the present disclosure is described. Firstly, if a charger is inserted in the charging interface 200 of the terminal 100, the charger IC 190 starts charging of the power source 170 by forming an electric power supply path so that the electric power provided by the charge is supplied to the power source 170 (101).

Here, the terminal 100 identifies whether the power source 170 is in a pre-charging section (103). At least one of the charger IC 190 and the gauge IC 180 can decide to pre-charging the power source 170 if the power state of the power source 170 is less than a predefined value, namely, a fully discharged state or almost discharged state. In particular, the charger IC 190 identifies whether the power source 170 is in a discharge state requiring pre-charging, and transmits the corresponding identification information to the gauge IC 180.

If the pre-charging is decided in Block 103, the gauge IC 180 wait for gauging while the charger IC 190 charges the power source with a predetermined amount of electric power (105). Namely, the gauge IC 180 cannot transmit gauging information but value "0" to the control unit 160 until the predefined amount of electric power is charged in the power source 170 and the pre-charging section is completed. The control unit 160 then controls the display unit 140 to output at least one of an icon, image, and indicator corresponding to charging amount "0" of the power source 170 (105). Here, the control unit 160 can block an output of charging request message or alarming a low voltage state of the power source 170 while the power source 170 is being charged through the pre-charging section in a state of the charger inserted.

Subsequently, the terminal 100 identifies whether the pre-charging is completed (107). At this block, the charger IC 190 identifies whether the pre-charging reached a predetermined level by detecting the charging state of the power source 170, and transmits it to the gauge IC 180. Alternatively, after receiving information of engaging the pre-charging section from the charger IC 190, the gauge IC 180 can identify whether the current charging state is at the time of completing the pre-charging by directly detecting the power source 170. If the pre-charging is completed, the procedure returns to Block 105 and repeats the following blocks.

If a charging amount (namely, charging voltage or charging current) of the power source 170 corresponding to completion of the pre-charging is detected at Block 107, the gauge IC 180 of the terminal 100 starts gauging (109). Namely, information of actual charging amount except "0" can be transmitted to the control unit 160 as gauging information. The control unit 160 stops outputting an image, icon, or indicator representing a state corresponding to a charging amount of the power source 170 "0", and controls to output another image, icon, or indicator representing a charging state of the power source 170. The gauge IC 180 of the terminal 100 then performs gauging based on the detected information (111). Namely, the gauge IC 180 detects the present voltage or current of the power source through the voltage sensor 183 or the current sensor 181, and transmits gauging information of charging state to the control unit 160 according to the detected current value or voltage value. The control unit 160 updates the display of fuel gauge based on the gauging information provided by the gauge IC 180.

Subsequently, the terminal 100 identifies whether the charging state of the power source 170 is in a full charging section (113). For this, the charger IC 190 continuously or periodically transmits information of final charging current of the power source 170 to the gauge IC 180. Alternatively, the gauge IC 180 can continuously or periodically detect the present voltage or current of the power source 170. If a current value equal to a predefined final charging current value is received from the charger IC 190, the gauge IC 180 can identify that the power source 170 is in a full charging section. If the power source 170 did not entered the full charging section, the gauge IC 180 returns to Block 109 and performs gauging based on at least one of a voltage value and current value detected respectively by the voltage sensor 183 and the current sensor 181.

If the power source 170 entered the full charging section, namely, if a detected value corresponding to the full charging section is received from the charger IC 190, the gauge IC 180 can perform gauging according to a change of final charging current provided by the charger IC 190 (115). In this process, the gauge IC 180 sets up a gauging information matching table according to the change of final charging current in advance and generates gauging information corresponding to the change of final charging current based on the matching table. The gauge IC 180 then transmits the gauging information to the control unit 160 so that the control unit 160 updates the fuel gauge based on the gauging information.

Subsequently, the terminal 100 identifies whether the power source 170 is in a fully charged state (117), and if the power source 170 is not in the fully charged state, the terminal 100 returns to Block 105 and repeats the following blocks until the charger is disconnected. The terminal 100 then control supplemental charging if the power source 170 is in the fully charged state (119). Namely, the terminal 100 isolates the power source 170 from the charger by cutting off the electric supply path between the fully charged power source 170 and the charger. If the discharge amount of the power source 170 is greater than a predefined value, terminal 100 performs recharging of the power source 170. As described above, the terminal 100 can perform recharging not according to a voltage drop due to a poor impedance of the power source 170 or deterioration of physical properties but according to the change of charged power amount of the power source 170. Such a control of supplemental charging can be performed until the charger is separated from the charging interface 200 or a new power source is connected to the charger.

As described above, the method for processing a power source state and the terminal supporting the same according to embodiments of the present disclosure supports so that the power source 170 is normally charged and the corresponding charging state is normally displayed regardless of differences of physical properties between the charger IC 190 charging the power source 170 and the gauge IC 180 gauging the charging state of the power source 170. For this, the present disclosure can perform at least one of a procedure providing information collected by the charger IC 190 for the gauge IC 180 and a procedure providing information collected by the gauge IC 180 for the charger IC 190. The procedures can be performed in various ways according to a designer's intention. For example, the gauge IC 180 can receive information collected by the charger IC 190, and a control of displaying a fuel gauge can be performed based on the received information. Further, a procedure commanding termination of charging can be decided not by the charger IC 190 but by the gauge IC 180, and thereby a display of fuel gauge and charging state can be more properly achieved according to a charging method or a charging form. Through such a function, the present disclosure enables a user to correctly identify a charging state by matching an operation of displaying a charging state to an actual operation of charging the power source. Therefore, the user can more correctly identify a charging state of the power source 170 and more actively control a charging of the power source 170.

The terminal 100 can further include various additional modules according to a provision type. Namely, the terminal 100 can include components not described above, such as a near field communication module for a communication terminal, interface for data transmission in a wired communication method or in a wireless communication method of the terminal 100, internet communication module connecting to the internet and performing an internet function, and digital broadcast module receiving a digital broadcast and performing a play function. These components have a wide variation according to a trend of convergence, and thereby all the items cannot be listed here, however a component having the same level as the above configuration can be further included in the above device. Of course, a specific component can be omitted or replaced by another one according to the provision type of the terminal 100 according to the present disclosure. It would be obvious to a person having ordinary skill in the art.

Further, the terminal 100 according to certain embodiments of the present disclosure can includes all the mobile communication terminals operating by communication protocols corresponding to various communication systems, PMP (Portable Multimedia Player), digital broadcast player, PDA (Personal Digital Assistant), music player (for example, MP3 player), portable game terminal, smart phone, information and communication equipment, and multimedia equipment such as a notebook and handheld PCs, and their application equipments.

Although the present disclosure has been described with an certain embodiments, various changes and modifications can be suggested to one skilled in the art. It is intended that the present disclosure encompass such changes and modifications as fall within the scope of the appended claims.

What is claimed is:

1. A terminal supporting a power source state processing, comprising:
a power source configured to supply an electric power;
a charger IC configured to collect power source information transmitted from a charger to the power source and control a pre-charging section in which the power source is charged by a predefined electric power when the power source is fully discharged or almost fully discharged;
a gauge IC configured to collect charging information of the power source and to generate gauging information to display a fuel gauge indicating a charging state of the power source based on the power source information;
a control unit configured to control to be displayed the fuel gauge based on the gauging information; and
a display unit configured to display the fuel gauge.

2. The terminal of claim 1, wherein the charger IC is further configured to transmit information about the pre-charging section of the power source to the gauge IC.

3. The terminal of claim 2, wherein the gauge IC is configured to generate gauging information such that the power source state is displayed as "0" while the power source is in the pre-charging section and to transmit the gauging information to the control unit.

4. The terminal of claim 2, wherein the gauge IC is configured to stop detecting the power source while the power source is in the pre-charging section and to generate gauging information based on the information transmitted by the charger IC.

5. The terminal of claim 2, wherein the gauge IC is configured to generate corresponding gauging information by detecting at least one of a voltage and a current of the power source if information about completing the pre-charging section of the power source is received from the charger IC.

6. The terminal of claim 1, wherein the gauge IC is configured to detect at least one of a voltage and a current of the power source in the charging section charging a predetermined amount and before a fully charged state corresponding to completion of charging the power source, and to generate the gauging information based on the detected voltage or current.

7. The terminal of claim 1, wherein the gauge IC is configured to generate gauging information corresponding to a change of final charging current by using the power source information received from the charger IC in a full charging section in which charging of the power source is not less than a predetermined ratio.

8. The terminal of claim 1, wherein the gauge IC is configured to request the charger IC for completion of charging if the power source identifies a fully charged state.

9. The terminal of claim 1, wherein the charger IC is configured to transmit to the gauge IC a current amount for charging the power source and distribution information of a current amount for driving the control unit.

10. The terminal of claim 9, wherein the gauge IC is further configured to:
identify a charging state of the power source as a fully charged state when the current amount for charging the power source is less than a predefined value and the charging the power source is maintained for a predefined time, and to generate gauging information accordingly; and
generate gauging information corresponding to a charging state of the power source based on the distribution information when the current amount for charging the power source is decreased to a predetermined value according to the distribution of current for driving the control unit.

11. The terminal of claim 1, wherein the charger IC is configured to perform supplemental charging or recharging of the power source when a charged amount is decreased to a predetermined value due to a natural discharge after full charging of the power source, and to control the charging or recharging when the charged amount is less than the predefined amount by checking a power capacity of the power source.

12. The terminal of claim 1, wherein the charger IC is configured to block a power source pass of a charger according to the full charging of the power source and transmits information of fully charged state to the gauge IC, and the gauge IC is configured not to apply a micro current detected according to the information of fully charged state transmitted by the charger IC to the displaying a fuel gauge if the micro current is detected from the power source in the fully charged state.

13. A method of processing a power source state, comprising:
supplying an electric power to a charger IC for charging a power source;
controlling a pre-charging section of the power source with a predefined electric power when the power source is in one of a fully discharged or an almost fully discharged state;
transmitting power source information collected by the charger IC to a gauge IC for displaying a charging state of the power source as a fuel gauge;
generating, by the gauge IC, gauging information for displaying the fuel gauge based on the power source information; and
displaying the fuel gauge based on the gauging information.

14. The method of claim 13, further comprising transmitting information about the pre-charging section of the power source to the gauge IC.

15. The method of claim 14, wherein the generating gauging information includes at least one of:
generating gauging information so that the power source state is displayed as "0" while the power source is in the pre-charging section and transmitting the gauging information to the control unit;
stopping detecting the power source while the power source is in the pre-charging section and generating gauging information based on the information transmitted by the charger IC; and
generating corresponding gauging information by detecting at least one of a voltage and current of the power source when completion information of the pre-charging section of the power source is received from the charger IC.

16. The method of claim 13, wherein the generating gauging information includes one of:
detecting at least one of a voltage and current of the power source in a charging section charging more than a predetermined amount and before a fully charged state corresponding to completion of charging the power source, and generating the gauging information based on the detected voltage or current; and
generating gauging information corresponding to a change of final charging current by using the power source information received by the gauge IC from the charger IC.

17. The method of claim 13, wherein the generating gauging information includes:
generating gauging information corresponding to a charging state of the power source based on the distribution information when a current amount for charging the power source and distribution information of a current amount for driving the control unit are transmitted to the gauge IC, or if the current amount for charging the power source is decreased to a predetermined value according to the distribution of current for driving the control unit.

18. The method of claim 13, further comprising:
performing supplemental charging or recharging of the power source when a charged amount is decreased to a predetermined value due to a natural discharge after full charging of the power source, and performing the charging or recharging if the charged amount is identified less than the predefined value by checking a power capacity of the power source.

19. The method of claim 18, further comprising:
blocking a power source pass of a charger corresponding to the full charging of the power source and transmitting information of full charging to the gauge; and
halting a micro current detected according to the information of full charging transmitted by the charger IC to the displaying a fuel gauge if the micro current is detected from the power source in the fully charged state.

20. The method of claim 13, further comprising:
requesting the charger IC for completion of charging when the gauge IC identifies a fully charged state of the power source.

* * * * *